US012803569B2

(12) United States Patent
Hong

(10) Patent No.: US 12,803,569 B2
(45) Date of Patent: Nov. 17, 2026

(54) ANALOG-TO-DIGITAL CONVERSION APPARATUS AND METHOD HAVING DATA STORAGE MECHANISM

(71) Applicant: REALTEK SEMICONDUCTOR CORPORATION, Hsinchu (TW)

(72) Inventor: Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 128 days.

(21) Appl. No.: 18/960,957

(22) Filed: Nov. 26, 2024

(65) Prior Publication Data

US 2025/0175186 A1 May 29, 2025

(30) Foreign Application Priority Data

Nov. 28, 2023 (TW) ................................. 112146029

(51) Int. Cl.
*H03M 1/10* (2006.01)

(52) U.S. Cl.
CPC ................................. *H03M 1/1038* (2013.01)

(58) Field of Classification Search
CPC ................................................... H03M 1/1038
See application file for complete search history.

(56) References Cited

U.S. PATENT DOCUMENTS 9,172,389 B2 * 10/2015 Liu ....................... H03M 1/403
10,177,779 B2 * 1/2019 Lee ....................... H03M 1/462
2023/0147156 A1 5/2023 Fajarmega
2023/0336184 A1 10/2023 Huang

OTHER PUBLICATIONS

OA letter of a counterpart TW application (appl. No. 112146029) mailed on Nov. 18, 2024.
Tsai et al., "A 0.003 mm 10 b 240 MS/s 0.7 mW SAR ADC in 28 nm CMOS With Digital Error Correction and Correlated-Reversed Switching", Jun. 2015, IEEE Journal of Solid-State Circuits.
Liu et al., "A 10 bit 320 MS/s Low-Cost SAR ADC for IEEE 802.11ac Applications in 20 nm CMOS", Nov. 2015, IEEE Journal of Solid-State Circuits.

* cited by examiner

*Primary Examiner* — Khai M Nguyen
(74) *Attorney, Agent, or Firm* — WPAT, PC

(57) ABSTRACT

The present disclosure discloses an analog-to-digital conversion apparatus having a data storage mechanism that includes an analog-to-digital conversion (ADC) circuit having a conversion circuit, a comparison result storage circuit and a calibration circuit. The conversion circuit includes a capacitor array circuit, a comparison circuit and a capacitor control circuit. The capacitor array circuit, corresponding to a sampling stage of a conversion process, receives an analog input voltage to perform capacitor-switching operation to generate analog output voltages. The comparison circuit sequentially generates comparison results according to the analog output voltages. The capacitor control circuit controls the capacitor array circuit to perform capacitor-switching operation according to the comparison results by using successive-approximation register mechanism. The comparison result storage circuit stores the comparison results. The calibration circuit retrieves the comparison results to perform digital error correction to generate a digital output signal.

14 Claims, 6 Drawing Sheets

410

ANALOG-TO-DIGITAL CONVERSION APPARATUS AND METHOD HAVING DATA STORAGE MECHANISM

BACKGROUND OF THE INVENTION

1. Field of the Invention

The present disclosure relates to an analog-to-digital conversion apparatus and an analog-to-digital conversion method having a data storage mechanism.

2. Description of Related Art

An analog-to-digital conversion circuit is a circuit to convert an analog signal or a physical quantity (typically a voltage) of a continuous form to a digital signal. The analog-to-digital conversion circuit can be implemented by using different circuit configurations, in which a successive-approximation register (SAR) analog-to-digital conversion circuit is one of them.

However, some of the analog-to-digital conversion circuits implemented by using the SAR ADC mechanism have a redundancy configuration that requires an additional calibration process to be performed on the converted result to generate the correct digital output signal. Under the condition that the analog-to-digital conversion circuit operates at a frequency that becomes higher and higher, the conversion result of a conversion process may be replaced by the conversion result of the next conversion process before the calibration process is finished being performed such that the digital output signal is not correct.

SUMMARY OF THE INVENTION

In consideration of the problem of the prior art, an object of the present disclosure is to provide an analog-to-digital conversion apparatus and an analog-to-digital conversion method having a data storage mechanism.

The present invention discloses an analog-to-digital conversion (ADC) apparatus having a data storage mechanism that includes at least one ADC conversion circuit. The at least one ADC conversion circuit includes a conversion circuit, a comparison results storage circuit and a calibration circuit. The conversion circuit includes a capacitor array circuit, a comparison circuit and a capacitor control circuit. The capacitor array circuit is configured to receive a pair of analog input voltages corresponding to a sampling stage of a conversion process and perform a capacitor-switching operation corresponding to a conversion stage in the conversion process to generate a pair of analog output voltages. The comparison circuit is configured to in turn generate a plurality of comparison results according to the pair of analog output voltages in the conversion stage. The capacitor control circuit is configured to in turn control the capacitor array circuit to perform the capacitor-switching operation according to the comparison results by using a successive-approximation register (SAR) mechanism in the conversion stage. The comparison results storage circuit is configured to store the comparison results. The calibration circuit is configured to retrieve the comparison results from the comparison results storage circuit to perform a digital error correction (DEC) according a plurality of weighting values to generate a digital output signal having a plurality of bits.

The present invention also discloses an analog-to-digital conversion method having a data storage mechanism used in an analog-to-digital conversion apparatus that includes steps outlined below. A pair of analog input voltages corresponding to a sampling stage of a conversion process are received and a capacitor-switching operation corresponding to a conversion stage in the conversion process is performed to generate a pair of analog output voltages by a capacitor array circuit of a conversion circuit of at least one ADC conversion circuit. A plurality of comparison results are in turn generated according to the pair of analog output voltages in the conversion stage by a comparison circuit of the conversion circuit. The capacitor array circuit is controlled to in turn perform the capacitor-switching operation according to the comparison results by using a successive-approximation register mechanism in the conversion stage by a capacitor control circuit of the conversion circuit. The comparison results are stored by a comparison results storage circuit included by the at least one ADC conversion circuit. The comparison results are retrieved from the comparison results storage circuit to perform a digital error correction according a plurality of weighting values to generate a digital output signal having a plurality of bits by a calibration circuit included by the at least one ADC conversion circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an analog-to-digital conversion apparatus and an analog-to-digital conversion method having a data storage mechanism to store comparison results generated by a conversion circuit by a comparison results storage circuit such that a digital error correction is performed in a sufficient time to allow the analog-to-digital conversion apparatus operates at a high speed.

Figure 1:
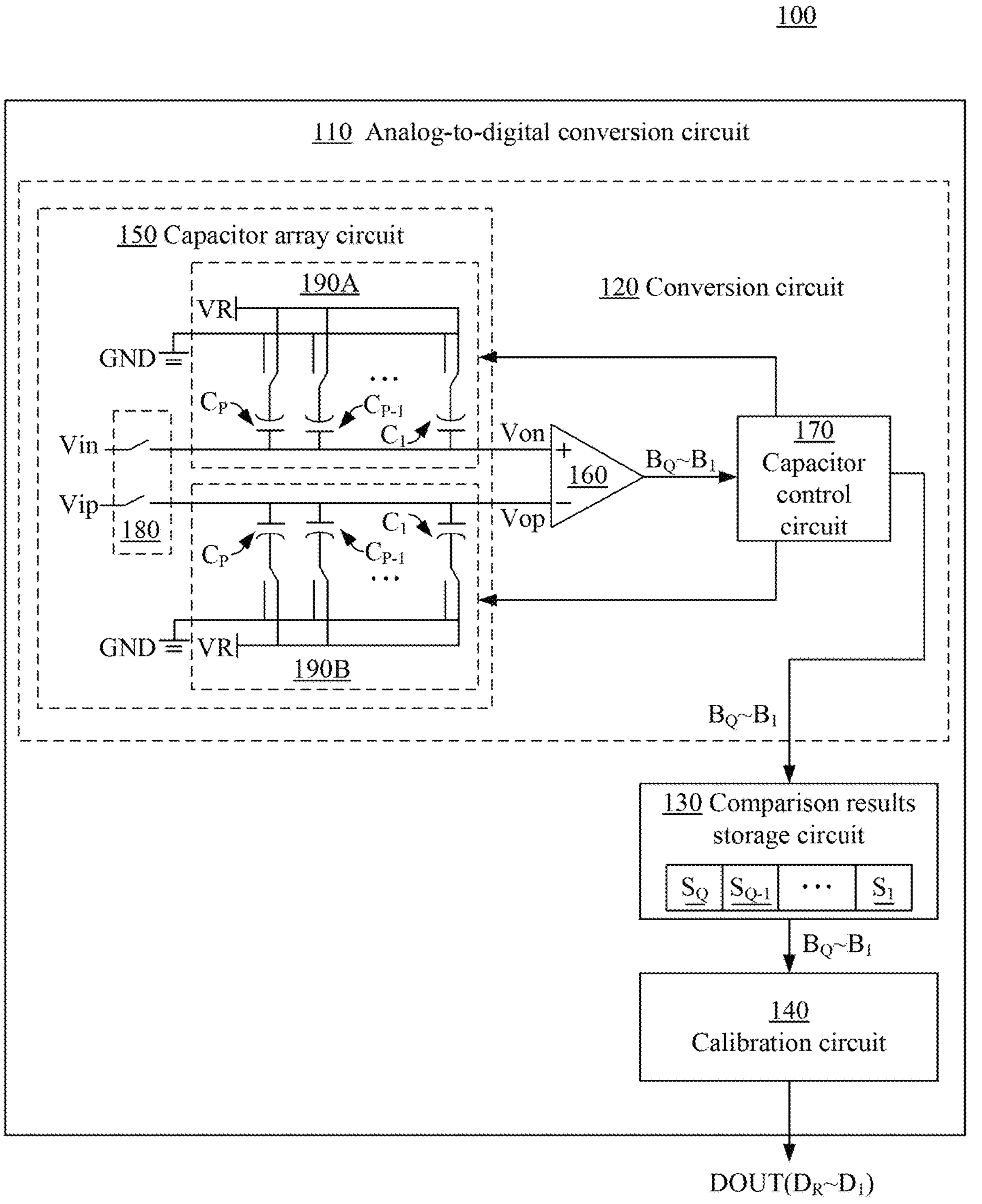
FIG. 1 illustrates a block diagram of an analog-to-digital conversion apparatus according to an embodiment of the present invention.

Reference is now made to FIG. 1. FIG. 1 illustrates a block diagram of an analog-to-digital conversion apparatus 100 having a data storage mechanism according to an embodiment of the present invention.

The analog-to-digital conversion apparatus 100 includes an analog-to-digital conversion circuit 110.

The analog-to-digital conversion circuit 110 includes a conversion circuit 120, a comparison results storage circuit 130 and a calibration circuit 140.

The conversion circuit 120 includes a capacitor array circuit 150, a comparison circuit 160 and a capacitor control circuit 170.

The capacitor array circuit 150 is configured to receive a pair of analog input voltages Vin and Vip corresponding to a sampling stage of a conversion process and perform a capacitor-switching operation corresponding to a conversion stage in the conversion process to generate a pair of analog output voltages Von and Vop.

In an embodiment, the capacitor array circuit 150 includes a sampling circuit 180 and two capacitor arrays 190A and 190B. The sampling circuit 180 performs sampling on the analog input voltages Vin and Vip. Each of the capacitor arrays 190A and 190B includes a plurality of bit capacitors $C_P$~$C_1$ having capacitances that can be the same or different from each other. P is a positive integer larger than 1.

In an embodiment, the capacitors of the bit capacitors $C_P$~$C_1$ corresponding to higher bits may have larger capacitances, and the capacitors of the bit capacitors $C_P$~$C_1$ corresponding to lower bits may have smaller capacitances. For example, the bit capacitors $C_P$~$C_1$ can be configured to allow the bit capacitor $C_P$ to have the largest capacitance and allow the bit capacitor $C_1$ to have the smallest capacitance. The bit capacitors between the bit capacitor $C_P$ and the bit capacitor $C_1$ may have the capacitances that decrease in an order, in which some of these capacitances may be the same. However, the present invention is not limited to such an arrangement.

Under the control of the capacitor control circuit 170, the bit capacitors $C_P$~$C_1$ can be switched to be electrically coupled to different voltage levels, e.g., one of the voltage VR and the ground voltage level GND illustrated in FIG. 1, to accomplish the capacitor-switching operation to generate different capacitor configurations. It is appreciated that in different embodiments, the bit capacitors $C_P$~$C_1$ can be switched one-by-one, or can be divided into different groups to be switched group-by-group. The present invention is not limited to a specific embodiment.

The capacitor arrays 190A and 190B generate different values of the analog output voltages Von and Vop according to the variation of the configuration of the bit capacitors $C_P$~$C_1$.

The comparison circuit 160 is configured to in turn generate a plurality of comparison results $B_Q$~$B_1$ according to the analog output voltages Von and Vop in the conversion stage. Q is a positive integer larger than 1. The capacitor control circuit 170 is configured to in turn control the capacitor array circuit 150 to perform the capacitor-switching operation described above according to the comparison results $B_Q$~$B_1$ by using a successive-approximation register (SAR) mechanism in the conversion stage.

In an embodiment, the capacitor control circuit 170 controls the capacitor array circuit 150 to perform the capacitor-switching operation in an order from the highest bit to the lowest bit such that the comparison circuit 160 generates the comparison results $B_Q$~$B_1$ in the order from the highest bit to the lowest bit.

The comparison results storage circuit 130 is configured to store the comparison results $B_Q$~$B_1$. In an embodiment, the comparison results storage circuit 130 may receive the comparison results $B_Q$~$B_1$ through the capacitor control circuit 170 as illustrated in FIG. 1, or directly receive the comparison results $B_Q$~$B_1$ from the comparison circuit 160.

In an embodiment, the comparison results storage circuit 130 includes a plurality of storage units $S_Q$~$S_1$, and a number of the storage units $S_Q$~$S_1$ corresponds to a number of the comparison results $B_Q$~$B_1$. The storage units $S_Q$~$S_1$ respectively store the comparison results $B_Q$~$B_1$.

In an embodiment, the analog-to-digital conversion circuit 110 has a redundancy configuration having redundant bits. As a result, the calibration circuit 140 is configured to retrieve the comparison results $B_Q$~$B_1$ from the comparison results storage circuit 130 to perform digital error correction (DEC) according to a plurality of weighting values to generate a digital output signal DOUT having a plurality of bits $D_R$~$D_1$. R is a positive integer larger than 1.

For example, when Q is 7, the weighting values that the comparison results $B_7$~$B_1$ are 30, 14, 8, 4, 4, 2 and 1. In the weighting values described above, 30 can be expressed as a sum of the values of 16+8+4+2, each being a power of 2. 14 can also expressed as a sum of the values of 8+4+2, each being a power of 2. The calibration circuit 140 may include such as, but not limited to a plurality of full adders corresponding to different weighting values of different numbers of power such that the comparison results $B_7$~$B_1$ are fed to the corresponding full adders according to the weighting values to perform the calculation of addition and carrying to output the digital output signal DOUT with R bits. In an embodiment, R is 6 to correspond to the digital output signal DOUT of 6 bits $D_6$~$D_1$.

It is appreciated that the number of the comparison results and the digital output signal is merely an example. In other embodiments, the number of the comparison results and the digital output signal can be different based on the different switching methods used by the capacitor arrays 190A and 190B and the different digital error correction methods used by the calibration circuit 140. Further, the configuration and the calculation method of the calibration circuit 140 described above is merely an example. In other embodiments, the calibration circuit 140 may include other calculation circuits and perform the calculation by using other methods. The present invention is not limited to the embodiment described above.

Since the digital error correction performed by the calibration circuit 140 takes time, the comparison results $B_Q$~$B_1$ generated by the current conversion process may be replaced by the comparison results of the next conversion process if the conversion circuit 120 begins to perform the next conversion process before the calibration circuit 140 finishes performing calculation. Therefore, the calibration circuit 140 may not output a correct calculation result.

As a result, by disposing the comparison results storage circuit 130, the comparison results $B_Q$~$B_1$ can be stored such that the calibration circuit 140 has a sufficient time to perform calculation and output the correct digital output signal DOUT.

It is appreciated that in an embodiment, each of the storage units $S_Q$~$S_1$ in the comparison results storage circuit 130 has at least one flip-flop, and the number of the flip-flop in each of the storage units $S_Q$~$S_1$ is the same. The number of the flip-flop determines the timing that the calibration circuit 140 begins to perform the digital error correction.

Figure 2:
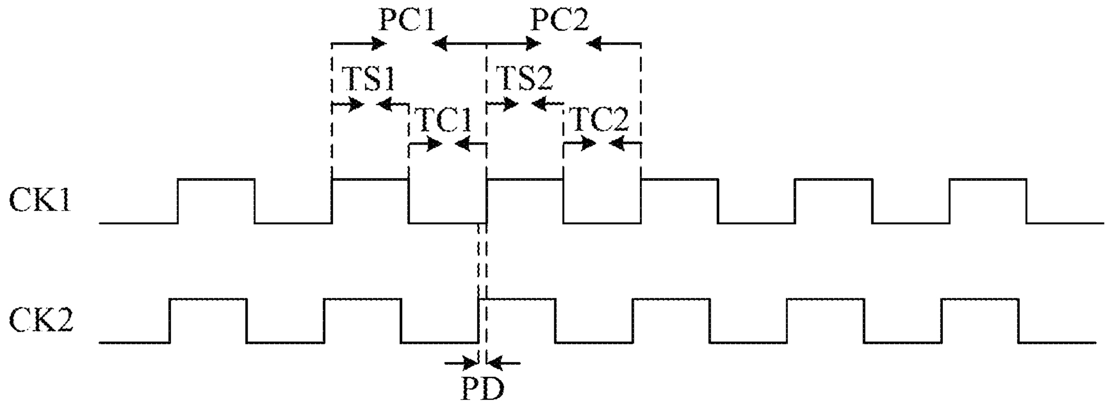
FIG. 2 illustrates a diagram of the waveform of the clock signals related to the operation of the analog-to-digital conversion circuit according to an embodiment of the present invention.

Reference is now made to FIG. 2 at the same time. FIG. 2 illustrates a diagram of the waveform of the clock signals related to the operation of the analog-to-digital conversion circuit 110 according to an embodiment of the present invention.

In an embodiment, the conversion circuit 120 in FIG. 1 operates according to a plurality of clock periods of a first clock signal CK1 illustrated in FIG. 2.

In an embodiment, each of the clock periods includes a sampling time and a conversion time after the sampling time. Take a current clock period PC1 that the first clock signal CK1 includes as an example, the conversion circuit 120 performs the sampling stage of the conversion process in the sampling time TS1 of the current clock period PC1 and performs the conversion stage of the conversion process in the conversion time TC1 after the sampling time TS1 in the current clock period PC1.

The conversion circuit 120 may perform the operation same as that in current clock period PC1 in any one of the clock periods after the first clock signal CK1. For example, the conversion circuit 120 may perform the sampling stage, of the next conversion process in the sampling time TS2 of the clock period PC2 next to the current clock period PC1 and perform the conversion stage of the next conversion process in the conversion time TC2 of the clock period PC2 after sampling time TS2. So on and so forth.

In the present embodiment, the first clock signal CK1 is at the high state in the sampling time (e.g., the sampling times TS1 and TS2) of each of the clock periods and is at the low state in the conversion time (e.g., the conversion times TC1 and TC2) of each of the clock periods. However, the present invention is not limited thereto.

In an embodiment, the comparison results storage circuit 130 in FIG. 1 operates according to a second clock signal CK2 illustrated in FIG. 2. The second clock signal CK2 has a second frequency the same as a first frequency of the first clock signal CK1 and a second phase different from a first phase of the first clock signal CK1 such that for each of the plurality of clock periods, the comparison results storage circuit 130 stores the comparison results $B_Q$~$B_1$ according to the second clock signal CK2 before the conversion time finishes.

Take the embodiment in FIG. 2 as an example, the phase of the second clock signal CK2 is slightly ahead of the phase of the first clock signal CK1, in which a phase difference PD exists therebetween. For the current clock period PC1, the comparison results storage circuit 130 stores the comparison results $B_Q$~$B_1$ generated by the comparison circuit 160 in FIG. 1 according to the second clock signal CK2 before the conversion time TC1 finishes. As a result, the comparison results $B_Q$~$B_1$ generated corresponding to the current clock period PC1 can be stored before the sampling time TS2 of the next clock periods PC2 begins without being affected by the next conversion process.

Corresponding to the conversion process of the current clock period PC1, the calibration circuit 140 performs the digital error correction in a correction time after the current clock period PC1. For example, such a correction time may correspond to the sampling time TS of the next clock periods PC2. However, the time spot that the calibration circuit 140 actually performs the digital error correction may be determined according to the timing provided by the comparison results storage circuit 130. The present invention is not limited thereto.

Figure 3:
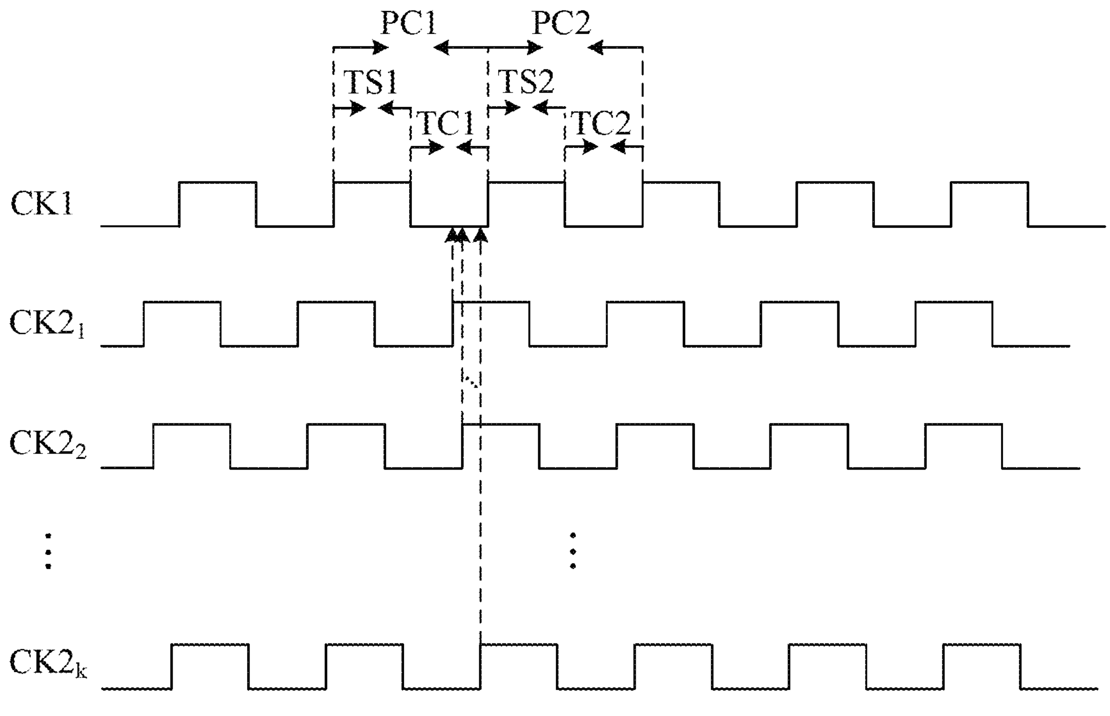
FIG. 3 illustrates a diagram of the waveform of the clock signals related to the operation of the analog-to-digital conversion circuit according to another embodiment of the present invention.

Reference is now made to FIG. 3 at the same time. FIG. 3 illustrates a diagram of the waveform of the clock signals related to the operation of the analog-to-digital conversion circuit 110 according to another embodiment of the present invention.

FIG. 3 also illustrates the first clock signal CK1 that the conversion circuit 120 in FIG. 1 operates accordingly, and the relation between the conversion circuit 120 and the first clock signal CK1 is the same as the relation described in FIG. 2. The detail is not described herein.

In the present embodiment, the comparison results storage circuit 130 in FIG. 1 operates according to the plurality of the second clock signals $CK2_1$~$CK2_K$ in FIG. 3. Each of the second clock signals $CK2_1$~$CK2_K$ has a second frequency the same as the first frequency of the first clock signal CK1 and a second phase different from the first phase of the first clock signal CK1, and the second phase of each of the second clock signals $CK2_1$~$CK2_K$ is different from each other.

The comparison results $B_Q$~$B_1$ are categorized into a plurality of comparison results groups, and a number K of the second clock signals $CK2_1$~$CK2_K$ corresponds to a number of the comparison results groups. For each of the plurality of clock periods, the comparison results storage circuit 130 in turn stores the comparison results groups respectively according to the corresponding second phase of the second clock signals $CK2_1$~$CK2_K$ before the conversion time finishes.

Take the embodiment in FIG. 3 as an example, the phases of the second clock signals $CK2_1$~$CK2_K$ are all ahead of the phase of the first clock signal CK1. For the current clock period PC1, the comparison results storage circuit 130 in turn stores the comparison results in these comparison results groups according to the second clock signals $CK2_1$~$CK2_K$ before the conversion time TC1 finishes. As a result, the comparison results $B_Q$~$B_1$ generated corresponding to the current clock period PC1 can be stored before the sampling time TS of the next clock periods PC2 begins without being affected by the next conversion process.

In a numerical example, K is 3. The comparison results $B_Q$~$B_1$ are categorized into 3 comparison results groups, such that the comparison results storage circuit 130 in turn store the 3 comparison results groups respectively according to the second clock signals $CK2_1$, $CK2_2$ and $CK2_3$ before the conversion time TC1 finishes. In an embodiment, K equals to Q. The comparison results $B_Q$~$B_1$ are categorized into Q comparison results groups such that the comparison results storage circuit 130 stores the Q comparison results groups respectively according to the second clock signals $CK2_1$~$CK2_Q$ before the conversion time TC1 finishes.

The analog-to-digital conversion apparatus stores the comparison results generated by the conversion circuit by the comparison results storage circuit such that the digital error correction is performed in a sufficient time to allow the analog-to-digital conversion apparatus operates at a high speed.

Figure 4:
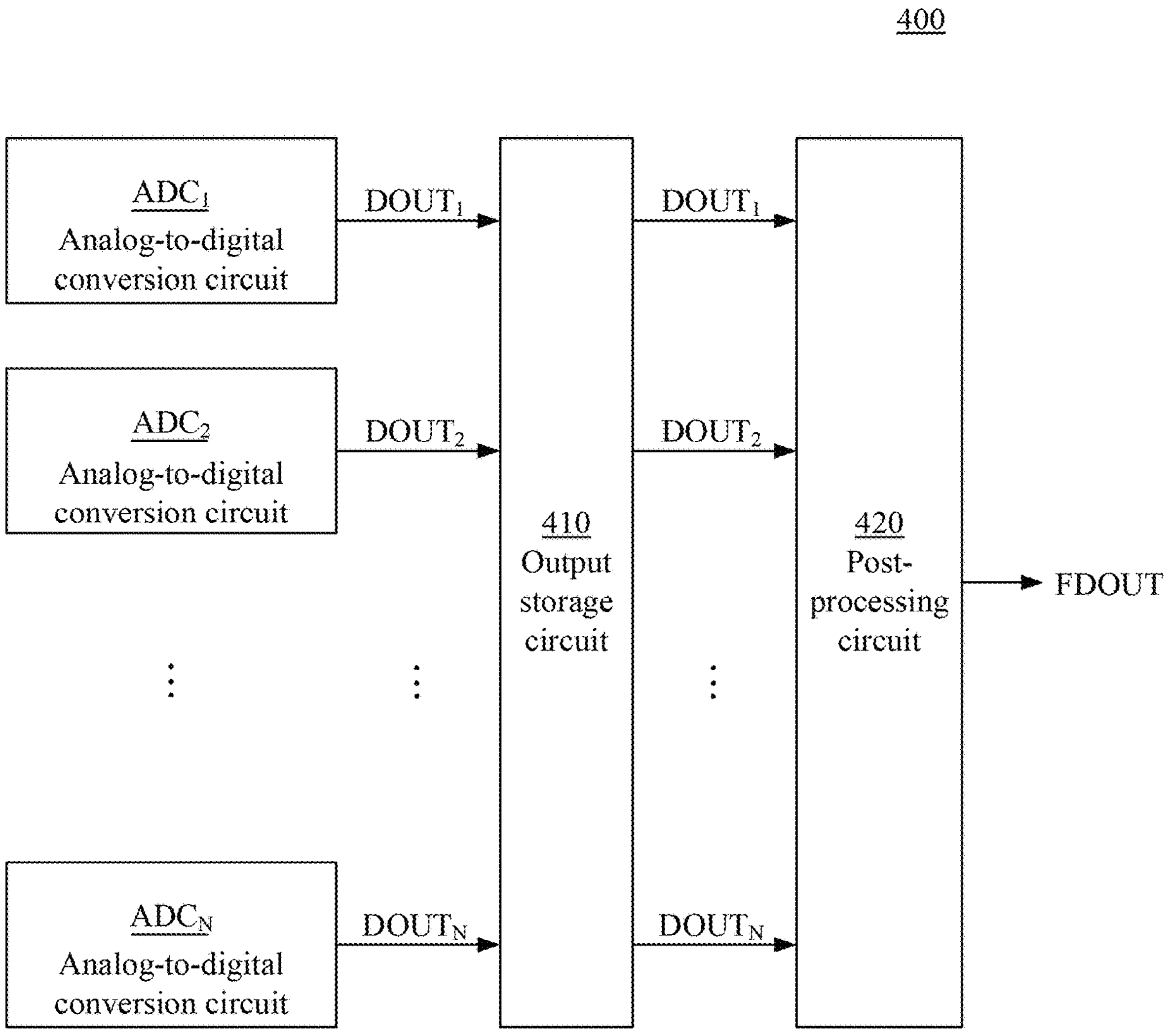
FIG. 4 illustrates a block diagram of an analog-to-digital conversion apparatus having a data storage mechanism.

Reference is now made to FIG. 4. FIG. 4 illustrates a block diagram of an analog-to-digital conversion apparatus 400 having a data storage mechanism according to another embodiment of the present invention.

The analog-to-digital conversion apparatus 400 includes a plurality of analog-to-digital conversion circuits $ADC_1$~$ADC_N$, an output storage circuit 410 and a post-processing circuit 420.

Each of the analog-to-digital conversion circuit $ADC_1$~$ADC_N$ in FIG. 4 may have the configuration and the operation method same as those of the analog-to-digital conversion circuit 110 in FIG. 1. The detail is not described herein.

The number of the analog-to-digital conversion circuits $ADC_1$~$ADC_N$ in FIG. 4 is an integer N larger than 1 to be configured as a time-interleaved analog-to-digital conversion circuit. In order to be configured as the time-interleaved analog-to-digital conversion circuit, required circuit components (not illustrated in the figure) may be additionally disposed between each two of these analog-to-digital conversion circuits $ADC_1$~$ADC_N$. The present invention is not limited to a specific embodiment.

The output storage circuit 410 is configured to store the N digital output signals $DOUT_1$~$DOUT_N$ generated by the N analog-to-digital conversion circuits $ADC_1$~$ADC_N$.

The post-processing circuit 420 is configured to retrieve and process the N digital output signals $DOUT_1$~$DOUT_N$ from the output storage circuit 410 to generate a final digital output signal FDOUT. In an embodiment, the post-processing circuit 420 is configured to perform digital error correction or other processing on the digital output signals $DOUT_1$~$DOUT_N$.

Since the processing performed by the post-processing circuit 420 takes time, the information of the digital output signals $DOUT_1$~$DOUT_N$ generated in the current conversion process may be replaced by the digital output signals of the next conversion process if the analog-to-digital conversion circuits $ADC_1$~$ADC_N$ already begins the processing of the subsequent conversion process before the post-processing circuit 420 finishes performing processing, such that the post-processing circuit 420 may not output a correct calculation result.

As a result, by disposing the output storage circuit 410, the digital output signals $DOUT_1$~$DOUT_N$ can be stored such that the post-processing circuit 420 has a sufficient time to perform calculation and output the correct final digital output signal FDOUT.

In an embodiment, the N analog-to-digital conversion circuits $ADC_1$~$ADC_N$ are categorized into M conversion circuit groups.

The configuration of the output storage circuit 410 can be related to the configuration of the conversion circuit groups, in which the output storage circuit 410 may include a plurality of storage circuit categorized into a plurality of circuit layers having a number of at least M and coupled in series.

When a number S is not larger than M, the S-th circuit layer receives and stores the digital output signal generated by the S-th conversion circuit group and receives and stores the digital output signal transmitted by the S−1-th circuit layer. When S is larger than M, the S-th circuit layer receive and stores the digital output signal transmitted by the S−1-th circuit layer. The post-processing circuit 420 retrieves and processes the N digital output signals from a last circuit layer.

A numerical example of M being 2 and N being 16 is used to describe the categorization of the analog-to-digital conversion circuits. Under such a condition, the analog-to-digital conversion circuits $ADC_1$~$ADC_{16}$ are categorized into 2 conversion circuit groups. For example, the analog-to-digital conversion circuits $ADC_1$~$ADC_6$ are categorized into the first conversion circuit group and the analog-to-digital conversion circuits $ADC_7$~$ADC_{16}$ are categorized into the second conversion circuit group.

Figure 5:
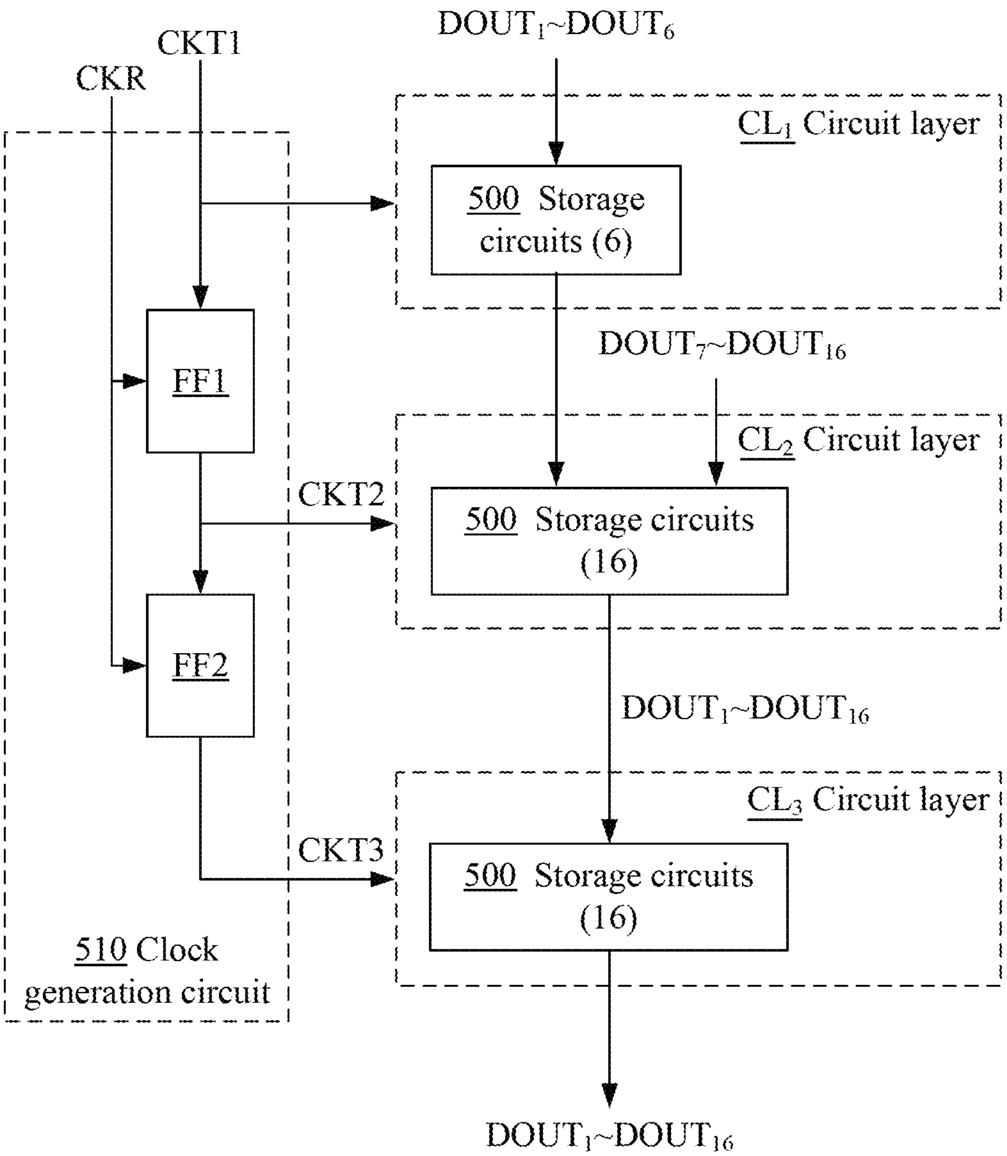
FIG. 5 illustrates a block diagram of the output storage circuit according to an embodiment of the present invention.

Reference is now made to FIG. 5. FIG. 5 illustrates a block diagram of the output storage circuit 410 according to an embodiment of the present invention.

Corresponding to the numerical example described above, the output storage circuit 410 in FIG. 5 includes a plurality of storage circuits 500 categorized into 3 circuit layers $CL_1$~$CL_3$.

For the first circuit layer $CL_1$ (S=1, which is smaller than M), the 0-th circuit layer is absent. As a result, the first circuit layer $CL_1$ only receives and stores the digital output signals $DOUT_1$~$DOUT_6$ generated by the first conversion circuit group. As a result, the first circuit layer $CL_1$ can be configured to include 6 storage circuits 500 to correspondingly receive the digital output signal $DOUT_1$~$DOUT_6$. It is appreciated that in order to keep the diagram simple, only a single block is illustrated to be the storage circuits 500 and the number of the storage circuits 500 are labeled in FIG. 5 instead of showing all of the storage circuits 500.

For the second circuit layer $CL_2$ (S=2, which equals to M), the second circuit layer $CL_2$ receives and stores the digital output signal $DOUT_7$~$DOUT_{16}$ generated by the second conversion circuit group and receives and stores the digital output signal $DOUT_1$~$DOUT_6$ transmitted by the first circuit layer $CL_1$. As a result, the second circuit layer $CL_2$ can be configured to include 16 storage circuits 500 to correspondingly receive the digital output signals $DOUT_1$~$DOUT_{16}$. It is appreciated that in order to keep the diagram simple, only a single block is illustrated to be the storage circuits 500 and the number of the storage circuits 500 are labeled in FIG. 5 instead of showing all of the storage circuits 500.

For the third circuit layer $CL_3$ (S=3, which is larger than M), the third circuit layer $CL_3$ receives and stores the digital output signal $DOUT_1$~$DOUT_{16}$ transmitted by the second circuit layer $CL_2$. As a result, the third circuit layer $CL_3$ can be configured to include 16 storage circuits 500 to correspondingly receive the digital output signals $DOUT_1$~$DOUT_{16}$. It is appreciated that in order to keep the diagram simple, only a single block is illustrated to be the storage circuits 500 and the number of the storage circuits 500 are labeled in FIG. 5 instead of showing all of the storage circuits 500.

The post-processing circuit 420 retrieves and processes the 16 digital output signal $DOUT_1$~$DOUT_{16}$ from the last circuit layer $CL_3$.

As a result, in the example described above, the circuit layers $CL_1$~$CL_2$ actually divide the digital output signals $DOUT_1$~$DOUT_{16}$ into different groups to store these groups and the circuit layer $CL_3$ can be selectively disposed to provide an additional timing.

In an embodiment, the output storage circuit 410 in FIG. 5 further includes a clock generation circuit 510 configured to provide a plurality of triggering clock signals CKT1~CKT3 having different phases to the circuit layers $CL_1$~$CL_3$ such that each of the circuit layers $CL_1$~$CL_3$ in turn performs signal receiving and signal outputting according to one of the triggering clock signals CKT1~CKT3.

In an embodiment, the clock generation circuit 510 may include a plurality of flip-flops FF1 and FF2. The flip-flops FF1 and FF2 are coupled in series to receive the triggering clock signal CKT1 and a reference clock signal CKR having a frequency higher than that of the triggering clock signal CKT1 to adjust the phase of the triggering clock signal CKT1 according to the reference clock signal CKR to generate the triggering clock signals CKT2 and CKT3.

In an embodiment, according to the required timings, the phase of the triggering clock signal CKT2 is different from the phase of the triggering clock signal CKT1 by 90 degrees, and the phase of the triggering clock signal CKT3 is different from the phase of the triggering clock signal CKT1 by 180 degrees. Moreover, according to the required timings, the storage circuits 500 in each of the circuit layers $CL_1$~$CL_3$ may be triggered to perform signal receiving and signal outputting selectively according to the rising edge or the falling edge of the clock signals described above. For example, the storage circuits 500 in the circuit layer $CL_1$ may be triggered by the falling edge of the triggering clock signal CKT1, the storage circuits 500 in the circuit layer $CL_2$ may be triggered by the rising edge of the triggering clock signal CKT2, and the storage circuits 500 in the circuit layer $CL_3$ may be triggered by the falling edge of the triggering clock signal CKT3. However, the present invention is not limited thereto.

Another numerical example of M being 1 and N being 16 is used to describe the categorization of the analog-to-digital conversion circuits. Under such a condition, the analog-to-digital conversion circuits $ADC_1$~$ADC_{16}$ are categorized into 1 conversion circuit group.

Figure 6:
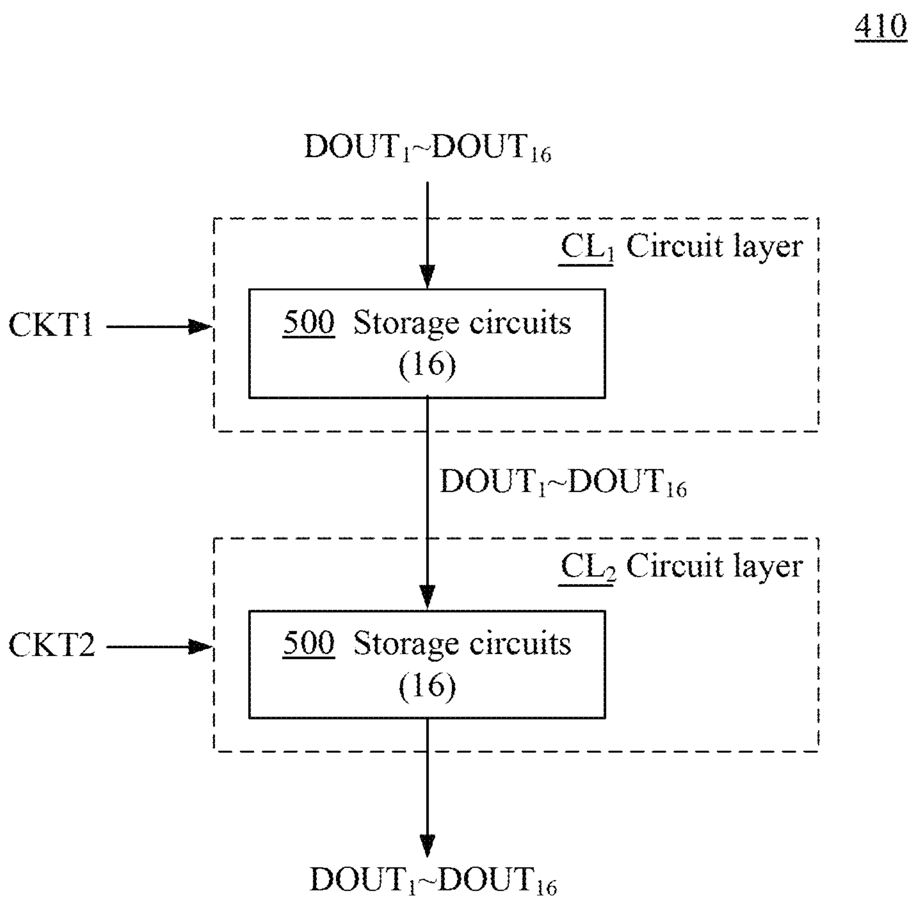
FIG. 6 illustrates a block diagram of the output storage circuit according to an embodiment of the present invention.

Reference is now made to FIG. 6. FIG. 6 illustrates a block diagram of the output storage circuit 410 according to an embodiment of the present invention.

Corresponding to the numerical example described above, the output storage circuit 410 in FIG. 6 includes a plurality of storage circuits 500 categorized into 2 circuit layers $CL_1$~$CL_2$.

For the first circuit layer $CL_1$ (S=1, which equals to M), the 0-th circuit layer is absent. As a result, the first circuit layer $CL_1$ receives and stores the digital output signals $DOUT_1$~$DOUT_{16}$ generated by the first conversion circuit group. As a result, the first circuit layer $CL_1$ can be configured to include 16 storage circuits 500 to correspondingly receive the digital output signal $DOUT_1$~$DOUT_{16}$. It is appreciated that in order to keep the diagram simple, only a single block is illustrated to be the storage circuits 500 and the number of the storage circuits 500 are labeled in FIG. 6 instead of showing all of the storage circuits 500.

For the second circuit layer $CL_2$ (S=2, which is larger than M), the second circuit layer $CL_2$ receives and stores the digital output signal $DOUT_1$~$DOUT_{16}$ transmitted by the first circuit layer $CL_1$. As a result, the second circuit layer $CL_2$ can be configured to include 16 storage circuits 500 to correspondingly receive the digital output signals $DOUT_1$~$DOUT_{16}$. It is appreciated that in order to keep the diagram simple, only a single block is illustrated to be the storage circuits 500 and the number of the storage circuits 500 are labeled in FIG. 6 instead of showing all of the storage circuits 500.

The post-processing circuit 420 retrieves and processes the 16 digital output signal $DOUT_1$~$DOUT_{16}$ from the last circuit layer $CL_2$.

As a result, in the example described above, the circuit layer $CL_1$ actually stores the digital output signals $DOUT_1$~$DOUT_{16}$ and the circuit layer $CL_2$ can be selectively disposed to provide an additional timing.

In the present embodiment, the circuit layer $CL_1$ and the circuit layer $CL_2$ may directly receive the triggering clock signal CKT1 and the triggering clock signal CKT2 having different phases without the disposition of the clock generation circuit.

It is appreciated that the number of the conversion circuit groups and the number of the circuit layers described above are merely an example. In different embodiments, the number of the conversion circuit groups and the number of the circuit layers can be different depending on practical requirements. The present invention is not limited thereto.

Figure 7:
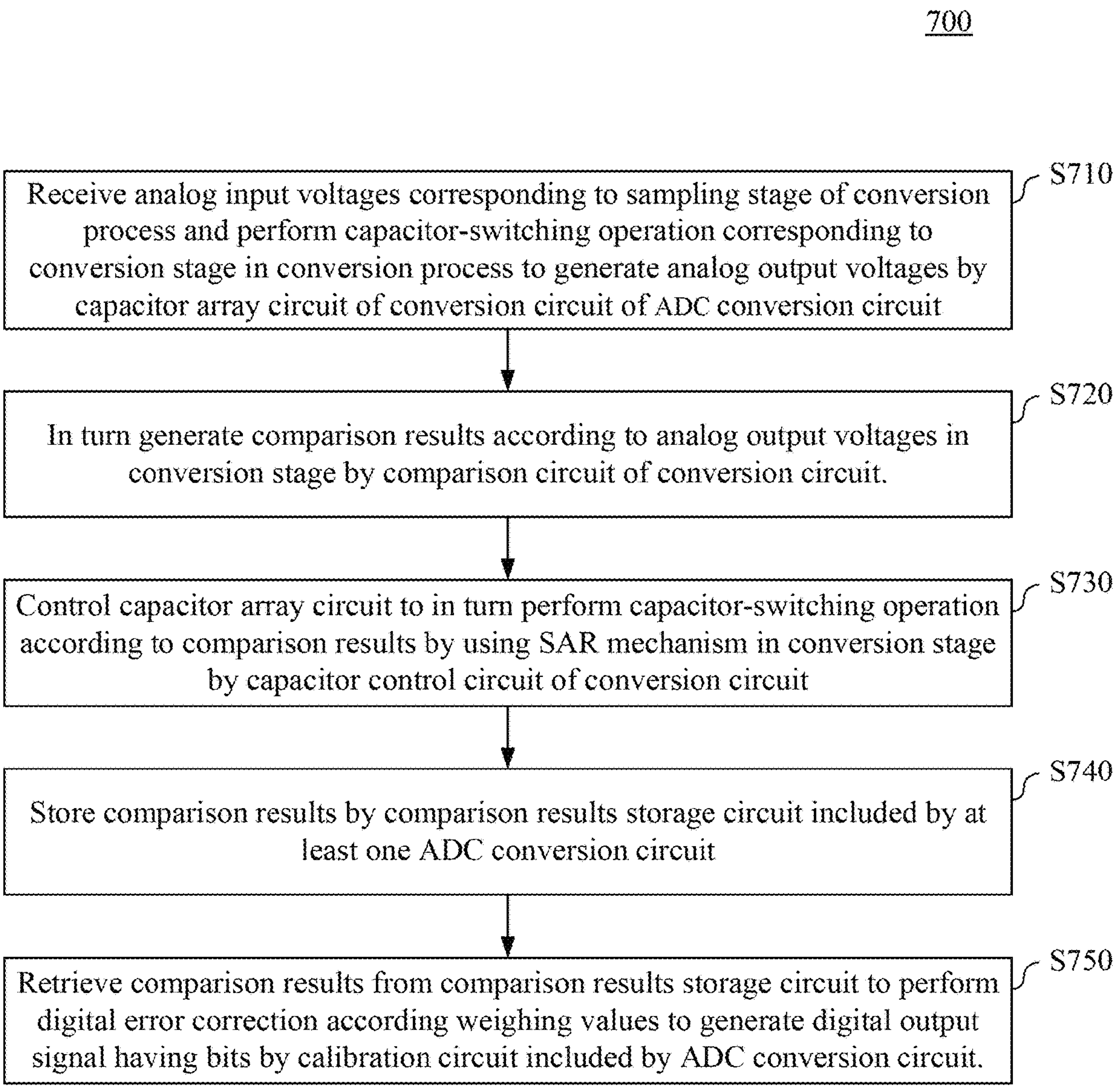
FIG. 7 illustrates a flow chart of an analog-to-digital conversion method according to an embodiment of the present invention.

Reference is now made to FIG. 7. FIG. 7 illustrates a flow chart of an analog-to-digital conversion method 700 according to an embodiment of the present invention.

Besides the apparatus described above, the present invention further discloses the analog-to-digital conversion method 700 having a data storage mechanism that can be used in such as, but not limited to the analog-to-digital conversion apparatus 100 illustrated in FIG. 1. An embodiment of the analog-to-digital conversion method 700 is illustrated in FIG. 7 and includes the steps outlined below.

In step S710, the pair of analog input voltages Vin and Vip corresponding to the sampling stage of the conversion process are received and the capacitor-switching operation corresponding to the conversion stage in the conversion process is performed to generate the pair of analog output voltages Von and Vop by the capacitor array circuit 150 of the conversion circuit 120 of the ADC conversion circuit 110.

In step S720, the plurality of comparison results $B_Q$~B are in turn generated according to the pair of analog output voltages Von and Vop in the conversion stage by the comparison circuit 160 of the conversion circuit 120.

In step S730, the capacitor array circuit 150 is controlled to in turn perform the capacitor-switching operation according to the comparison results $B_Q$~$B_1$ by using the successive-approximation register mechanism in the conversion stage by the capacitor control circuit 170 of the conversion circuit 120.

In step S740, the comparison results $B_Q$~$B_1$ are stored by the comparison results storage circuit 130 included by the ADC conversion circuit 110.

In step S750, the comparison results $B_Q$~$B_1$ are retrieved from the comparison results storage circuit 130 to perform the digital error correction according the plurality of weighting values to generate the digital output signal DOUT having the plurality of bits $D_R$~$D_1$ by the calibration circuit 140 included by the ADC conversion circuit 110.

It is appreciated that the embodiments described above are merely an example. In other embodiments, it is appreciated that many modifications and changes may be made by those of ordinary skill in the art without departing, from the spirit of the invention.

In summary, the analog-to-digital conversion apparatus and the analog-to-digital conversion method having a data storage mechanism of the present invention store the comparison results generated by the conversion circuit by the comparison results storage circuit such that the digital error correction is performed in a sufficient time to allow the analog-to-digital conversion apparatus operates at a high speed.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An analog-to-digital conversion (ADC) apparatus having a data storage mechanism, comprising:

at least one ADC conversion circuit, comprising:

a conversion circuit operating according to a plurality of clock periods of a first clock signal, in which each of the plurality of clock periods comprises a sampling time and a conversion time after the sampling time, the conversion circuit comprising:

a capacitor array circuit configured to receive a pair of analog input voltages corresponding to a sampling stage of a conversion process and perform a capacitor-switching operation corresponding to a conversion stage in the conversion process to generate a pair of analog output voltages, wherein the conversion circuit performs the sampling stage of the conversion process in the sampling time of a current clock period of the plurality of clock periods and performs the conversion stage of the conversion process in the conversion time of the current clock period;

a comparison circuit configured to in turn generate a plurality of comparison results according to the pair of analog output voltages in the conversion stage; and a capacitor control circuit configured to in turn control the capacitor array circuit to perform the capacitor-switching operation according to the comparison results by using a successive-approximation register (SAR) mechanism in the conversion stage;

a comparison results storage circuit configured to store the comparison results, wherein the comparison results storage circuit operates according to a second clock signal having a second frequency the same as a first frequency of the first clock signal and a second phase different from a first phase of the first clock signal such that for each of the plurality of clock periods, the comparison results storage circuit stores the comparison results according to the second clock signal before the conversion time finishes; and a calibration circuit configured to retrieve the comparison results from the comparison results storage circuit to perform a digital error correction (DEC) according to a plurality of weighting values to generate a digital output signal having a plurality of bits.

2. The analog-to-digital conversion apparatus of claim 1, wherein the calibration circuit performs the digital error correction in a correction time after the current clock period corresponding to the conversion process performed in the current clock period.

3. The analog-to-digital conversion apparatus of claim 1, wherein the second clock signal comprises a plurality of clock signals such that the comparison results storage circuit operates according to the plurality of second clock signals each having the second frequency the same as the first frequency of the first clock signal and the second phase different from the first phase of the first clock signal, and the second phase of each of the plurality of clock signals is different from each other; and the plurality of comparison results are categorized into a plurality of comparison results groups, and a number of the plurality of clock signals corresponds to a number of the plurality of comparison results groups such that for each of the plurality of clock periods, the comparison results storage circuit in turn stores the plurality of comparison results groups respectively according to the second phase of the plurality of clock signals before the conversion time finishes.

4. The analog-to-digital conversion apparatus of claim 1, wherein the comparison results storage circuit comprises a plurality of storage units each comprising at least one flip-flop, in which a number of the at least one flip-flop comprised by each of the plurality of storage units is the same, and the plurality of storage units respectively store the plurality of comparison results.

5. The analog-to-digital conversion apparatus of claim 1, wherein a number of the analog-to-digital conversion circuit is an integer N larger than 1 to be configured as a time-interleaved analog-to-digital conversion circuit, the analog-to-digital conversion apparatus further comprises:

an output storage circuit configured to store the N digital output signals generated by the N analog-to-digital conversion circuits; and a post-processing circuit configured to retrieve and process the N digital output signals from the output storage circuit to generate a final digital output signal.

6. The analog-to-digital conversion apparatus of claim 5, wherein the N analog-to-digital conversion circuits are categorized in to M conversion circuit groups, the output storage circuit comprises a plurality of storage circuits categorized into a plurality of circuit layers having a number of at least M and coupled in series;

wherein when a number S is not larger than M, a S-th circuit layer of the plurality of circuit layers receives and stores the digital output signal generated by a S-th conversion circuit group of the plurality of conversion circuit groups and receives and stores the digital output signal transmitted by a S−1-th circuit layers of the plurality of circuit layers;

when S is larger than M, the S-th circuit layer of the plurality of circuit layers receives and stores the digital output signal transmitted by the S−1-th circuit layer of the plurality of circuit layers; and the post-processing circuit retrieves and processes the N digital output signals from a last circuit layer of the plurality of circuit layers.

7. The analog-to-digital conversion apparatus of claim 6, wherein the output storage circuit further comprises a clock generation circuit configured to provide a plurality of triggering clock signals having different phases to the circuit layers such that each of the plurality of circuit layers in turn performs signal receiving and signal outputting according to one of the plurality of triggering clock signals.

8. An analog-to-digital conversion method having a data storage mechanism used in an analog-to-digital conversion apparatus, comprising:

operating a conversion circuit of at least one ADC conversion circuit according to a plurality of clock periods of a first clock signal, in which each of the plurality of clock periods comprises a sampling time and a conversion time after the sampling time;

receiving a pair of analog input voltages corresponding to a sampling stage of a conversion process and performing a capacitor-switching operation corresponding to a conversion stage in the conversion process to generate a pair of analog output voltages by a capacitor array circuit of the conversion circuit, wherein the sampling stage is performed in the sampling time of a current clock period of the plurality of clock periods, and the conversion stage is performed in the conversion time of the current clock period;

in turn generating a plurality of comparison results according to the pair of analog output voltages in the conversion stage by a comparison circuit of the conversion circuit;

in turn controlling the capacitor array circuit to perform the capacitor-switching operation according to the comparison results by using a successive-approximation register mechanism in the conversion stage by a capacitor control circuit of the conversion circuit;

storing the comparison results by a comparison results storage circuit comprised by the at least one ADC conversion circuit, wherein the comparison results storage circuit operates according to a second clock signal having a second frequency the same as a first frequency of the first clock signal and a second phase different from a first phase of the first clock signal such that for each of the plurality of clock periods, and the comparison results storage circuit stores the plurality of comparison results according to the second clock signal before the conversion time finishes; and retrieving the comparison results from the comparison results storage circuit to perform a digital error correction according to a plurality of weighting values to generate a digital output signal having a plurality of bits by a calibration circuit comprised by the at least one ADC conversion circuit.

9. The analog-to-digital conversion method of claim 8, further comprising:

performing the digital error correction in a correction time after the current clock period corresponding to the conversion process performed in the current clock period by the calibration circuit.

10. The analog-to-digital conversion method of claim 8, wherein the second clock signal comprises a plurality of clock signals, and the analog-to-digital conversion method further comprises:

operating the comparison results storage circuit according to the plurality of clock signals each having the second frequency the same as the first frequency of the first clock signal and the second phase different from the first phase of the first clock signal, and the second phase of each of the plurality of clock signals is different from each other; and the plurality of comparison results are categorized into a plurality of comparison results groups, and a number of the plurality of clock signals corresponds to a number of the plurality of comparison results groups such that for each of the plurality of clock periods, the comparison results storage circuit in turn stores the plurality of comparison results groups respectively according to the second phase of the plurality of clock signals before the conversion time finishes.

11. The analog-to-digital conversion method of claim 8, wherein the comparison results storage circuit comprises a plurality of storage units each comprising at least one flip-flop, in which a number of the at least one flip-flop comprised by each of the plurality of storage units is the same, the analog-to-digital conversion method further comprises:

respectively storing the plurality of comparison results by the plurality of storage units.

12. The analog-to-digital conversion method of claim 8, wherein a number of the analog-to-digital conversion circuit is an integer N larger than 1 to be configured as a time-interleaved analog-to-digital conversion circuit, the analog-to-digital conversion method further comprises:

storing the N digital output signals generated by the N analog-to-digital conversion circuits by an output storage circuit comprised by the analog-to-digital conversion apparatus; and retrieving and processing the N digital output signals from the output storage circuit to generate a final digital output signal by a post-processing circuit comprised by the analog-to-digital conversion apparatus.

13. The analog-to-digital conversion method of claim 12, wherein the N analog-to-digital conversion circuits are categorized in to M conversion circuit groups, the output storage circuit comprises a plurality of storage circuits categorized into a plurality of circuit layers having a number of at least M and coupled in series, the analog-to-digital conversion method further comprises:

when a number S is not larger than M, receiving and storing the digital output signal generated by a S-th conversion circuit group of the plurality of conversion circuit groups and receiving and storing the digital output signal transmitted by a S−1-th circuit layers of the plurality of circuit layers by a S-th circuit layer of the plurality of circuit layers;

when S is larger than M, receiving and storing the digital output signal transmitted by the S−1-th circuit layer of the plurality of circuit layers by the S-th circuit layer of the plurality of circuit layers; and retrieving and processing the N digital output signals from a last circuit layer of the plurality of circuit layers by the post-processing circuit.

14. The analog-to-digital conversion method of claim 13, further comprising:

providing a plurality of triggering clock signals having different phases by a clock generation circuit further comprised by the output storage circuit to the circuit layers such that each of the plurality of circuit layers in turn performs signal receiving and signal outputting according to one of the plurality of triggering clock signals.

* * * * *